United States Patent
Vilhonen et al.

(10) Patent No.: US 6,958,657 B2
(45) Date of Patent: Oct. 25, 2005

(54) TUNING A LOOP-FILTER OF A PLL

(75) Inventors: Sami Vilhonen, Littoinen (FI); Jari Melava, Salo (FI)

(73) Assignee: Nokia Corporation, Espoo (FI)

( * ) Notice: Subject to any disclaimer, the term of this patent is extended or adjusted under 35 U.S.C. 154(b) by 17 days.

(21) Appl. No.: 10/641,726

(22) Filed: Aug. 15, 2003

(65) Prior Publication Data

US 2005/0046485 A1    Mar. 3, 2005

(51) Int. Cl.$^7$ ............................................. H03L 7/00
(52) U.S. Cl. ..................... 331/16; 331/175; 331/17; 331/185; 327/156; 327/157
(58) Field of Search ................. 331/185, 16, 17, 331/175, 25; 327/156, 157

(56) References Cited

U.S. PATENT DOCUMENTS

| | | | |
|---|---|---|---|
| 5,334,951 A | 8/1994 | Hogeboom | 331/1 A |
| 5,668,503 A | 9/1997 | Gersbach et al. | 331/1 A |
| 6,326,852 B1 * | 12/2001 | Wakayama | 331/17 |
| 6,437,615 B1 * | 8/2002 | Stascausky | 327/156 |

FOREIGN PATENT DOCUMENTS

WO         03100979        12/2003

* cited by examiner

*Primary Examiner*—Arnold Kinkead

(57) ABSTRACT

The invention relates to a method of automatically tuning a loop-filter of a phase locked loop. The loop-filter includes a capacitance at an output of a charge pump of the phase locked loop, and the charge pump provides current impulses to the loop-filter. In order to enable a simple tuning of the loop-filter, the method comprises adjusting the amplitude of the current impulses output by the charge pump essentially proportionally to the capacitance at the output of the charge pump. The invention relates equally to a phase locked loop comprising means for realizing this method and to a unit comprising such a phase locked loop.

7 Claims, 3 Drawing Sheets

TUNING A LOOP-FILTER OF A PLL

FIELD OF THE INVENTION

The invention relates to a method of automatically tuning a loop-filter in a phase locked loop. The invention relates equally to a phase locked loop comprising a loop-filter and to a unit comprising such a phase locked loop.

BACKGROUND OF THE INVENTION

Phase locked loops (PLL) are negative feedback loops which are well known from the state of the art.

A PLL comprises a voltage controlled oscillator (VCO), which generates the output signal of the PLL. This output signal can be used for example as local oscillator signal for a receiver mixer of a receiver chain or a transmitter mixer of a transmitter chain in a cellular phone. The VCO is driven by a loop-filter, which determines the loop characteristics of the PLL, e.g. the settling time and the loop stability. The response of the loop-filter has therefore to be very accurate.

In order to reduce the number of external or discrete components, it is further desirable to use an integrated loop-filter in a PLL. With an integrated loop-filter, also the probability of a disruptive coupling is reduced. The values of integrated components, however, vary much more than the values of external components which are more accurate due to process variations or environmental influences. External Negative Positive Zero (NPO) capacitors, for example, have a very stable value over a wide temperature range, usually between −25° C. and +85° C.

Therefore, conventional PLLs generally comprise accurate external components for the loop-filter. When an integrated loop-filter is used nevertheless, a complicated calibration procedure is employed.

SUMMARY OF THE INVENTION

It is an object of the invention to enable a simple tuning of a loop-filter of a PLL.

A method of automatically tuning a loop-filter of a phase locked loop is proposed. The loop-filter realizes a capacitance at an output of a charge pump of the phase locked loop, and the charge pump provides current impulses to the loop-filter. The proposed method comprises adjusting the amplitude of the current impulses output by the charge pump independently of said phase locked loop and essentially proportionally to the capacitance at the output of the charge pump.

Moreover, a phase locked loop is proposed, which comprises a loop-filter and a charge pump for providing current impulses to the loop-filter. The loop-filter realizes a capacitance at an output of the charge pump. The proposed phase locked loop further comprises a tuning component for adjusting the amplitude of current impulses output by the charge pump independently of said phase locked loop and essentially proportionally to the capacitance at the output of the charge pump.

Finally, a unit is proposed which comprises the proposed phase locked loop.

The invention proceeds from the consideration that a constant response of the loop-filter of a PLL is given, if the product of the impedance realized by the loop-filter at the output of a charge pump of the PLL on the one hand and the current supplied by the charge pump to the loop-filter on the other hand is constant. It is therefore proposed that variations in the capacitance at the output of the charge pump are compensated by adjusting the amplitude of the current impulses output by the charge pump. More specifically, the amplitude of the current impulses is adjusted independently of the phase locked loop and proportionally to the capacitance, i.e. the higher the capacitance, the higher the amplitude of the current impulses.

It is an advantage of the invention that it allows a simple tuning of a loop-filter without a complicated calibration circuit. The invention is of particular advantage for an integrated loop-filter.

In one embodiment of the invention, the output current of the charge pump is adjusted by providing a bias current to the charge pump, which is adjusted independently of the phase locked loop and essentially proportionally to the capacitance at the output of the charge pump.

Such a bias current can be provided for instance by a switched capacitor current generator, which is independent of the phase locked loop and suited to generate a current proportional to an included capacitor. Switching elements, like transistors, are used to this end for alternating a charging direction of the capacitor, and a converting element, which may include as well one or more transistors, is used for converting a voltage across the capacitor into a proportional current. If the capacitor is integrated on a single chip with the loop-filter, and if the capacitor has a capacitance which corresponds essentially to the capacitance realized by the loop-filter at the output of the charge pump, also variations in the capacitance of the capacitor of the current generator and in the capacitance at the output of the charge pump will correspond to each other. The current generator is therefore able to independently generate a bias current which is proportional to the capacitance at the output of the charge pump. A switched capacitor connection is described for example in Microelectronic circuits—Sedra-Smith, Saunders College Publishing.

Using a switched capacitor current generator as a tuning component has the advantage that it requires very little silicon area and that it is robust to process variations.

The invention can be employed in any unit which requires a PLL, for example in a communication unit like a cellular phone.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

DETAILED DESCRIPTION OF THE INVENTION

Figure 1:
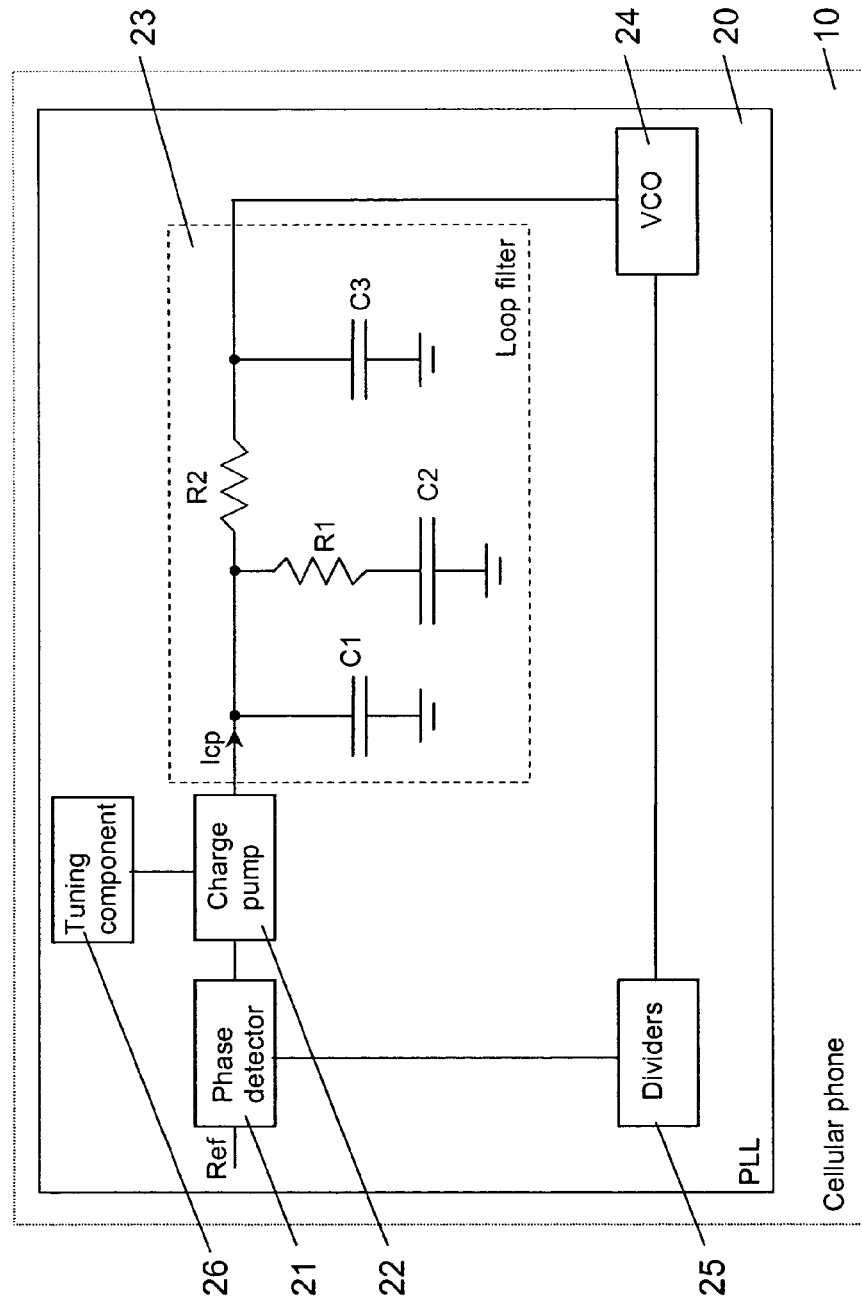
FIG. 1 is a schematic block diagram of an embodiment of a phase locked loop according to the invention.

FIG. 1 schematically presents a possible embodiment of a phase locked loop 20 according to the invention. The phase locked loop 20 can be used for instance in a cellular phone 10, indicated in FIG. 1 with dotted lines.

The PLL 20 includes, connected to each other in a loop in this order, a phase detector 21, a charge pump 22, a loop-filter 23, a VCO 24 and programmable frequency dividers 25.

The output of the charge pump 22 is thus connected to the input of the loop-filter 23. The input of the loop-filter 23 is connected within the loop-filter 23 via a first capacitor C1 to ground and in parallel via a series connection of a first resistor R1 and a second capacitor C2 to ground. The input of the loop-filter 23 is moreover connected within the loop-filter 23 via a second resistor R2 and a third capacitor C3 to ground. The connection between resistor R2 and capacitor C3 forms the output of the loop-filter 23, which is connected to the input of the VCO 24. The names of the capacitors denote at the same time their capacitance.

The PLL 20 includes in addition a tuning component 26, which is connected to the charge pump 22.

Beside the influence of the tuning component 26, the PLL 20 operates in a well known manner. The VCO 24 generates a signal having a phase which is determined by an applied voltage. The frequency of the output VCO signal is divided by the frequency dividers 25 and the resulting signal is forwarded to the phase detector 21. In addition, a reference signal Ref having a known frequency is applied to a reference input of the phase detector 21. The phase detector 21 compares the phase of the frequency divided VCO signal with the phase of the reference signal Ref and outputs an error signal. The PLL 20 is locked when the two phases are equal, which implies that also the frequencies of the compared signals are equal.

For achieving or maintaining a locked state, the charge pump 22 generates current impulses, the lengths of which are controlled by the output signal of the phase detector 21. As indicated by its name, the charge pump 22 thus pumps charges i.e. a supplied current. The amplitude Icp of the impulses is independently controlled by a bias current of the charge pump 22. The current impulses of the charge pump 22 are fed into the loop-filter 23.

The loop-filter 23 provides a capacitance C at the output of the charge pump 22, which is defined by the sum C1+C2+C3 of the respective capacitance of the three capacitors C1, C2, C3 of the loop-filter 23. The product of the corresponding impedance Z(C) at the output of the charge pump 22 and of the amplitude of the current impulses Icp output by the charge pump 22, i.e. Icp*Z(C), should be constant in spite of possible process variations in the production of the PLL 20 and of possible environmental influences. As the impedance Z(C) is proportional to 1/C, thus the quotient Icp/C should be constant.

This is achieved according to the invention by ensuring that the amplitude of the current impulses Icp output by the charge pump 22 is proportional to the capacitance C at the output of the charge pump 22. That is, it is ensured that if the capacitance C is relatively big, e.g. due to process variations, also the charging current Icp is relatively big. Accordingly, it is ensured that if the capacitance C is relatively small, also the charging current Icp is relatively small. Since the capacitance of capacitor C2 is significantly larger than the capacitance of the other capacitors C1 and C3, it will usually be sufficient to adjust the amplitude of the current impulses Icp depending on the size of capacitor C2. In the embodiment of FIG. 1, the tuning component 26 provides a bias current to the charge pump 22 which is proportional to the value of C2 for adjusting the amplitude of the current impulses Icp to be proportional to the value of C2, as will be explained further below.

Charging a capacitor with a current generates a potential difference across the capacitor, which is proportional to the integral of the charging current. The loop-filter 23 thus acts as an integrator. The voltage resulting across capacitor C3 is provided by the loop-filter 23 as a control voltage to the VCO 24 so that the VCO 24 generates a signal having a desired frequency. The frequency of the signal output by the VCO 24 can be changed by changing the factor in the programmable frequency dividers 25. The phase locked VCO signal can be provided for example as a local oscillator signal to a mixer of a transmitter chain (not shown) of the cellular phone 10.

Figure 2:
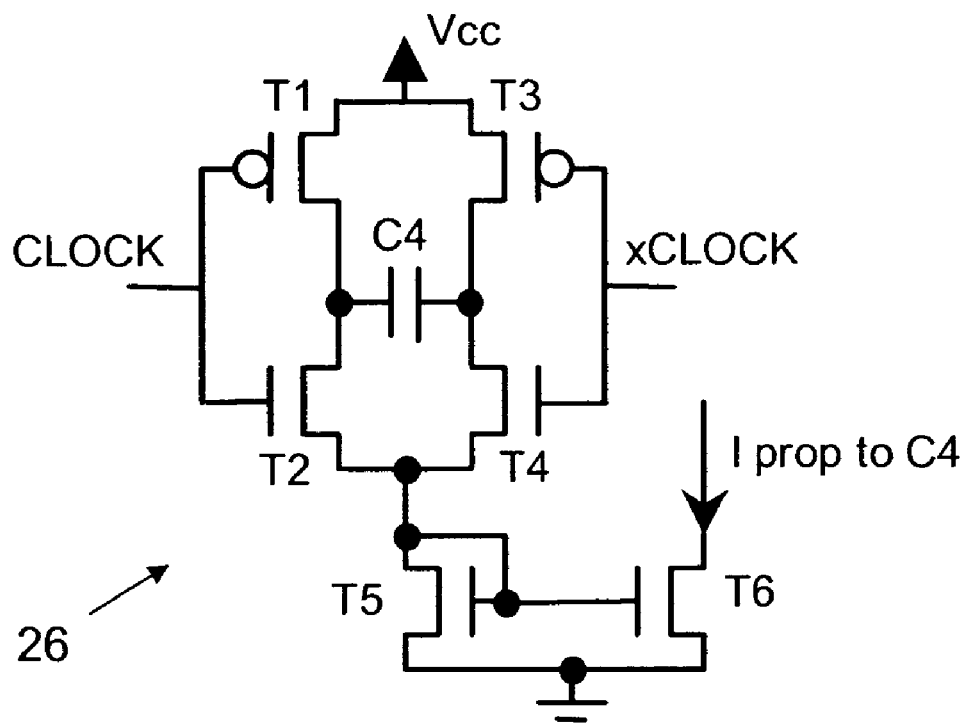
FIG. 2 is a schematic circuit diagram of a possible tuning component for the PLL of FIG. 1.

The tuning component 26 can be for example a switched capacitor based capacitance dependent current generator, as depicted in the circuit diagram of FIG. 2.

The current generator of FIG. 2 comprises a capacitor C4, which is fabricated on the same integrated circuit chip as the capacitors C1, C2, C3 of the loop-filter 23 and which has a capacitance corresponding to the capacitance of capacitor C2 of the loop-filter 23. A voltage supply Vcc of the current generator is connected via a first MOSFET T1 to a first terminal of capacitor C4 and via a third MOSFET T3 to a second terminal of capacitor C4. The first terminal of capacitor C4 and the second terminal of capacitor C4 are further connected via a second MOSFET T2 and a fourth MOSFET T4, respectively, to the drain and the gate of a fifth MOSFET T5. The source of the fifth MOSFET T5 is connected to ground. The gate of the fifth MOSFET T5 is moreover connected to the gate of a sixth MOSFET T6. The source of the sixth MOSFET T6 is equally connected to ground, while the drain of the sixth MOSFET T6 is connected to a bias current input of the charge pump 22.

Figure 3:
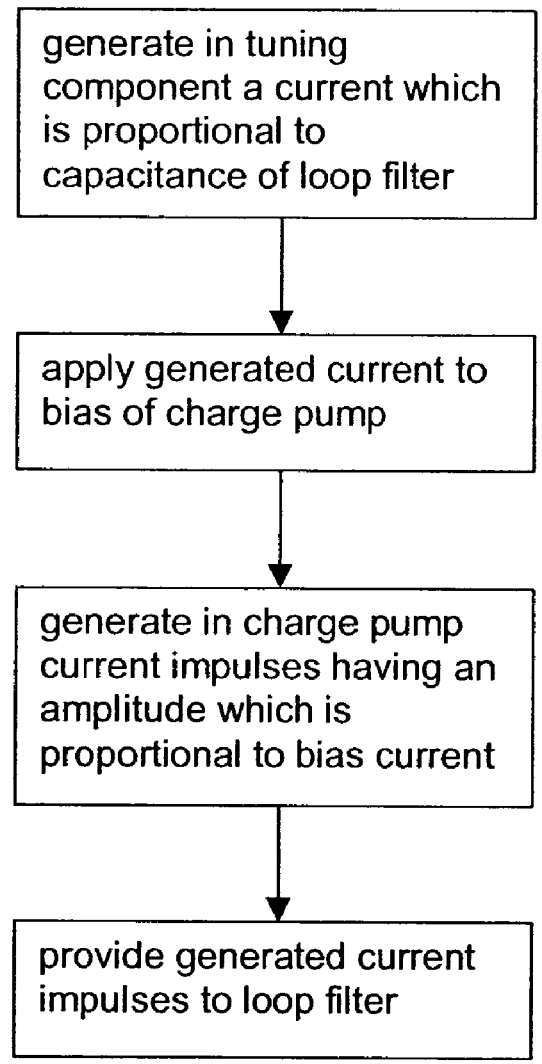
FIG. 3 is a flow chart illustrating the tuning of the PLL of FIG. 1.

The tuning of the loop filter 23 by means of the tuning component 26 is illustrated in the flow chart of FIG. 3 and will be explained in the following.

For switching the capacitor C4, a clock signal CLOCK is applied to the gate of MOSFET T2, while the inverted clock signal CLOCK is applied to the gate of MOSFET T1.

At the same time, a clock signal xCLOCK is applied to the gate of MOSFET T4, while the inverted clock signal xCLOCK is applied to the gate of MOSFET T3. Clock signals CLOCK and xCLOCK are basically complementary to each other.

As a result, the capacitor C4 is charged with alternating signs, the voltage reached across the capacitor C4 depending on the capacitance of capacitor C4. Thus, a voltage which is proportional to the capacitance of capacitor C4 is applied to the gate of MOSFET T6 such that a current I proportional to the capacitance of capacitor C4 will flow through MOSFET T6.

The current I flowing through MOSFET T6 is then applied as bias current to the charge pump 22.

Since capacitor C4 is fabricated on the same integrated circuit chip as capacitor C2, both capacitors are influenced by the same process variations and the same environmental influences, and the absolute value of the capacitors will follow each other. Consequently, the bias current applied to the charge pump 22 is proportional as well to capacitor C2 and thus essentially to the entire capacitance C at the output of the charge pump 22. Since moreover the amplitude of the current impulses Icp output by the charge pump 22 is determined by its bias current, also the amplitude of the current impulses Icp will be essentially proportional to the capacitance C at the output of the charge pump 22.

On the whole, it becomes apparent that the invention enables a simple tuning of the loop-filter 23 which does not require a complicated calibration circuit.

The tuning component 26 presented in FIG. 2 is very small and requires only a clock signal and a power supply as input. Further, it enables a continuous time system, which can be used as well in a continuous systems, such as WCDMA (Wideband Code Division Multiple Access), if the capacitors in the IC are sensitive e.g. to temperature variations.

While there have shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method of automatically tuning a loop-filter of a phase locked loop, which loop-filter includes a capacitance at an output of a charge pump of said phase locked loop, and which method comprises the steps of said charge pump providing current impulses to said loop-filter, and adjusting the amplitude of said current impulses output by said charge pump independently of said phase locked loop and essentially proportionally to said capacitance at said output of said charge pump.

2. A method according to claim 1, wherein the amplitude of said current impulses output by said charge pump is adjusted by providing a bias current to said charge pump, which bias current is adjusted essentially proportionally to said capacitance at said output of said charge pump.

3. A method of automatically tuning a loop-filter of a phase locked loop, which loop-filter includes a capacitance at an output of a charge pump of said phase locked loop, and which method comprises the steps of said charge pump providing current impulses to said loop-filter, and adjusting the amplitude of said current impulses output by said charge pump essentially proportionally to said capacitance at said output of said charge pump, wherein the amplitude of said current impulses output by said charge pump is adjusted by providing a bias current to said charge pump, which bias current is adjusted essentially proportionally to said capacitance at said output of said charge pump, and wherein said bias current is adjusted by a switched capacitor current generator alternating a charging direction of a capacitor and converting a voltage across said capacitor into said bias current, said capacitor being integrated on a single integrated circuit chip with said loop-filter and said capacitor having a capacitance which corresponds essentially to said capacitance at said output of said charge pump.

4. A phase locked loop comprising:
a loop-filter;
a charge pump for providing current impulses to said loop-filter, which loop-filter includes a capacitance at an output of said charge pump; and
a tuning component for adjusting the amplitude of current impulses output by said charge pump independently of said phase locked loop and essentially proportionally to said capacitance at said output of said charge pump.

5. A phase locked loop according to claim 4, wherein said tuning component is a current generator generating a current which is adjusted essentially proportionally to said capacitance at said output of said charge pump and providing said generated current as a bias current to said charge pump.

6. A phase locked loop comprising:
a loop-filter:
a charge pump for providing current impulses to said loop-filter, which loop-filter includes a capacitance at an output of said charge pump; and a tuning component for adjusting the amplitude of current impulses output by said charge pump and essentially proportionally to said capacitance at said output of said charge pump, wherein said tuning component is a current generator generating a current which is adjusted essentially proportionally to said capacitance at said output of said charge pump and providing said generated current as a bias current to said charge pump, wherein said current generator is a switched capacitor current generator including:
a capacitor, which capacitor is integrated on a single integrated circuit chip with said loop-filter and which capacitor has a capacitance which corresponds essentially to said capacitance at said output of said charge pump; switching elements for alternating a charging direction of said capacitor; and
a converting element for converting a voltage across said capacitor into said bias current.

7. A unit comprising a phase locked loop with
a loop-filter;
a charge pump for providing current impulses to said loop-filter, which loop-filter includes a capacitance at an output of said charge pump; and
a tuning component for adjusting the amplitude of current impulses output by said charge pump independently of said phase locked loop and essentially proportionally to said capacitance at said output of said charge pump.

* * * * *

UNITED STATES PATENT AND TRADEMARK OFFICE
CERTIFICATE OF CORRECTION

PATENT NO. : 6,958,657 B2  Page 1 of 1
APPLICATION NO. : 10/641726
DATED : October 25, 2005
INVENTOR(S) : Sami Vilhonen et al.

It is certified that error appears in the above-identified patent and that said Letters Patent is hereby corrected as shown below:

Column 6, line 23 (claim 6, line 2), ":" should be -- ; --.

Signed and Sealed this

First Day of August, 2006

JON W. DUDAS
*Director of the United States Patent and Trademark Office*